(12) United States Patent
Hisamoto et al.

(10) Patent No.: US 8,742,474 B2
(45) Date of Patent: Jun. 3, 2014

(54) POWER SEMICONDUCTOR DEVICE HAVING AN ACTIVE REGION AND AN ELECTRIC FIELD REDUCTION REGION

(75) Inventors: Yoshiaki Hisamoto, Tokyo (JP); Atsushi Narazaki, Tokyo (JP); Hitoshi Uemura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 964 days.

(21) Appl. No.: 11/937,725

(22) Filed: Nov. 9, 2007

(65) Prior Publication Data
US 2009/0014753 A1 Jan. 15, 2009

(30) Foreign Application Priority Data
Jul. 10, 2007 (JP) ................................. 2007-180931

(51) Int. Cl.
*H01L 29/66* (2006.01)
(52) U.S. Cl.
USPC ........... 257/263; 257/264; 257/328; 257/329; 257/E29.198; 257/E29.257
(58) Field of Classification Search
CPC ............ H01L 29/7395; H01L 29/7802; H01L 29/7827; H01L 29/66333; H01L 29/66666; H01L 29/66712
USPC .................... 257/E27.055, E21.383, E29.118, 257/E29.189, E21.198, 263, 329, 197, 273, 257/328, E29.027, E29.198, E29.257, 139, 257/147, E29.037, 264
See application file for complete search history.

(56) References Cited

U.S. PATENT DOCUMENTS

| | | | | |
|---|---|---|---|---|
| 5,668,385 A | * | 9/1997 | Bauer et al. | 257/139 |
| 7,250,639 B1 | * | 7/2007 | Suekawa | 257/133 |
| 7,470,952 B2 | * | 12/2008 | Ruething et al. | 257/327 |
| 2003/0057478 A1 | * | 3/2003 | Yun et al. | 257/328 |

(Continued)

FOREIGN PATENT DOCUMENTS

| | | |
|---|---|---|
| DE | 43 13 170 A1 | 10/1994 |
| DE | 696 10 970 T2 | 6/2001 |

(Continued)

OTHER PUBLICATIONS

Office Action issued May 30, 2012, in German patent Application No. 10 2008 008 152.3 with English-language translation).

(Continued)

*Primary Examiner* — S. V. Clark
*Assistant Examiner* — Jesse Y Miyoshi
(74) *Attorney, Agent, or Firm* — Oblon, Spivak, McClelland, Maier & Neustadt, L.L.P.

(57) ABSTRACT

A power semiconductor device of the present invention has an active region and an electric field reduction region and includes: an emitter region of a first conductivity type; a base region of a second conductivity type in contact with the emitter region; an electrical strength providing region of the first conductivity type in contact with the base region; a collector region of the second conductivity type in contact with the electrical strength providing region; and a collector electrode in contact with the collector region; wherein the collector region is disposed on both a active region and a electric field reduction region each containing a dopant of the second conductivity type, and the collector region disposed on the electric field reduction region includes a region having a lower density of carriers of the second conductivity type than the collector region disposed on the active region.

8 Claims, 7 Drawing Sheets

(56) References Cited

U.S. PATENT DOCUMENTS

| | | |
|---|---|---|
| 2003/0218220 A1 | 11/2003 | Takahashi et al. |
| 2005/0035405 A1 | 2/2005 | Mauder et al. |
| 2007/0120181 A1 | 5/2007 | Ruething et al. |

FOREIGN PATENT DOCUMENTS

| | | | | |
|---|---|---|---|---|
| DE | 103 02 628 | A1 | 12/2003 | |
| DE | 103 30 571 | A1 | 2/2005 | |
| DE | 10 2005 053 487 | A1 | 5/2007 | |
| JP | 4-30476 | | 2/1992 | |
| JP | 6-61495 | | 3/1994 | |
| JP | 9-199713 | | 7/1997 | |
| JP | 10-173174 | | 6/1998 | |
| JP | 2003-133556 | | 5/2003 | |
| JP | 2005-136092 | * | 5/2005 | ............ H01L 29/78 |
| JP | 2005-333055 | | 12/2005 | |
| JP | 2006-59876 | | 3/2006 | |
| JP | 2007-134714 | | 5/2007 | |

OTHER PUBLICATIONS

Office Action issued Aug. 28, 2012 in corresponding Japanese patent application w/ partial English Translation.
Office Action issued Feb. 26, 2013 in Japanese Patent Application No. 2007-180931 (with English translation).

* cited by examiner

POWER SEMICONDUCTOR DEVICE HAVING AN ACTIVE REGION AND AN ELECTRIC FIELD REDUCTION REGION

BACKGROUND OF THE INVENTION

1. Field of the Invention

The present invention relates to a power semiconductor device and a method for manufacturing the same. More particularly, the invention relates to a power semiconductor device in which ions in a predetermined area or areas of either the collector region or the buffer region or both are selectively activated by a laser annealing technique to improve characteristics of the power semiconductor device, such as short circuit capacity, and also relates to a method for manufacturing such a power semiconductor device.

2. Background Art

Power semiconductor devices have been widely used both in industrial appliances such as inverters and in household appliances such as microwave ovens. Especially, IGBTs (Insulated Gate Bipolar Transistors) have become popular as power electronic devices, since they have a low on-state voltage and provide increased electrical strength. An IGBT includes an emitter region of a first conductivity type and a base region of a second conductivity type in contact with each other. The base region constitutes a portion of the MOS structure and includes a region whose conductivity type can be reversed by applying a voltage to the gate of the MOS structure. An electrical strength providing region of the first conductivity type is provided in contact with the base region. When the IGBT is turned on, the resistance of the electrical strength providing region is reduced by conductivity modulation, resulting in a reduced on-state voltage. Further, a collector of the second conductivity type is provided in contact with the electrical strength providing region, and a guard ring structure (a loop-like structure) of the second conductivity type is provided along the periphery of the electrical strength providing region. The guard ring structure contributes to reducing the electric field in the electrical strength providing region.

When the IGBT is turned off, if an excessive number of carriers of the second conductivity type are present in the electrical strength providing region, it may result in degraded turn-off switching characteristics. Furthermore, the parasitic thyristor formed by the emitter region, the base region, the electrical strength providing region, and the collector region may turn on, resulting in degraded controllability of the current of the device.

Japanese Laid-Open Patent Publication No. 2003-133556 discloses a method for manufacturing an IGBT in which the collector region is formed only on the back side of the active region, which does not include guard rings. That is, the collector region does not extend directly below the guard rings. This avoids a situation where carriers of the second conductivity type are injected from the collector region into the electrical strength providing region in a quantity greater than an appropriate level when the IGBT is turned on, thereby preventing the problems described above. Other related art includes Japanese Laid-Open Patent Publication Nos. 2005-333055 and 2006-059876.

The IGBT and the manufacturing method therefor disclosed in the above Japanese Laid-Open Patent Publication No. 2003-133556 are adapted to prevent the problems of degraded turn-off switching characteristics of the IGBT and the turn-on of the parasitic thyristor. However, this IGBT is disadvantageous in that the collector region is not fully in ohmic contact with the collector electrode, since the collector region is formed only in the active region, that is, the collector region does not extend directly under the guard rings.

SUMMARY OF THE INVENTION

The present invention has been devised to solve the above problems. It is, therefore, an object of the present invention to provide a power semiconductor device adapted to prevent degradation of its switching characteristics and prevent the turn-on of the parasitic thyristor and in which the collector region is fully in ohmic contact with the collector electrode. Another object of the present invention is to provide a method for manufacturing such a power semiconductor device.

According to one aspect of the present invention, a power semiconductor device having an active region and an electric field reduction region and includes an emitter region of a first conductivity type, a base region of a second conductivity type in contact with the emitter region, an electrical strength providing region of the first conductivity type in contact with the base region, a collector region of the second conductivity type in contact with the electrical strength providing region, and a collector electrode in contact with the collector region. The collector region is disposed on both a active region and a electric field reduction region each containing a dopant of the second conductivity type, and the collector region disposed on the electric field reduction region includes a region having a lower density of carriers of the second conductivity type than the collector region disposed on the active region.

According to another aspect of the present invention, a power semiconductor device having an active region and an electric field reduction region and includes an emitter region of a first conductivity type, a base region of a second conductivity type in contact with the emitter region, an electrical strength providing region of the first conductivity type in contact with the base region, a collector region of the second conductivity type in contact with the electrical strength providing region, a buffer region of the first conductivity type disposed between the electrical strength providing region and the collector region and having a higher density of carriers of the first conductivity type than the electrical strength providing region, and a collector electrode in contact with the collector region. The buffer region disposed on both a active region and a electric field reduction region, and the buffer region disposed on the electric field reduction region includes a region having a higher density of carriers of the first conductivity type than the buffer region disposed on the active region.

According to another aspect of the present invention, a method for manufacturing a power semiconductor device having an active region and an electric field reduction region, the method includes, a backside grinding step of grinding a back side of the wafer by a back grinder, a collector forming step of implanting ions in the back side of the wafer to form a collector region, a collector activating step of, by laser annealing, activating the ions implanted in the collector forming step, an electrode forming step of forming an electrode on the back side of the wafer, and an electrode heating step of heating the electrode formed in the electrode forming step. The collector region disposed on both the active region and the electric field reduction region, and the collector activating step includes annealing a region of the collector region disposed on the electric field reduction region with lower laser power than that used to anneal the collector region disposed on the active region.

Other and further objects, features and advantages of the invention will appear more fully from the following description.

DETAILED DESCRIPTION OF THE PREFERRED EMBODIMENTS

First Embodiment

Figure 1:
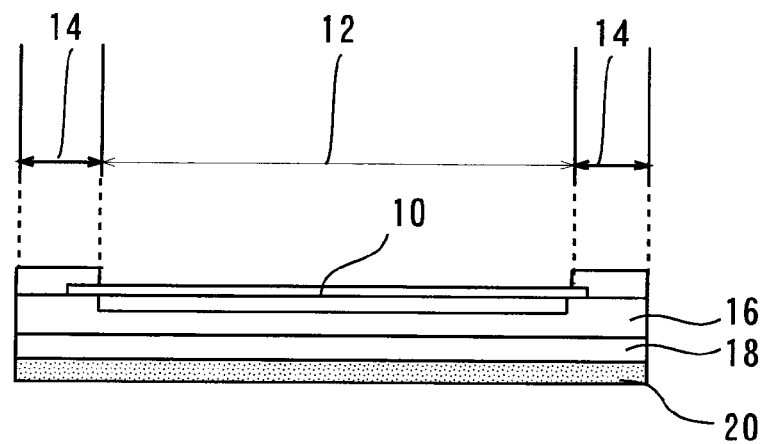
FIG. 1 is an elevational view of an IGBT chip (a power semiconductor device) according to a first embodiment.
Figure 2:
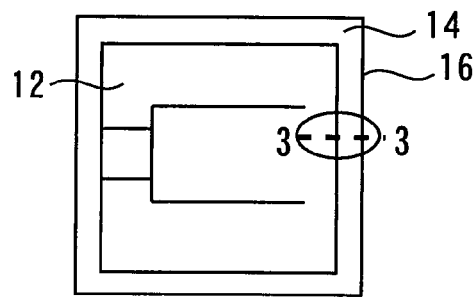
FIG. 2 is a plan view of this IGBT according to a first embodiment.

FIG. 1 is an elevational view of an IGBT chip (a power semiconductor device) according to a first embodiment of the present invention, and FIG. 2 is a plan view of this IGBT. The IGBT of the present embodiment includes an N-type silicon substrate 16 having a specific resistance of 250-300 O/cm. The thickness of the silicon substrate 16 must be at least such that the IGBT has sufficient electrical strength. For example, a 3300 V IGBT includes a silicon substrate with a thickness of approximately 400 μm. Referring to FIG. 1, an active region 12 including a MOS region (described later) is formed on the top side of the silicon substrate 16. The active region 12 is the carrier transport region of the IGBT.

Referring to FIGS. 1 and 2, an electric field reduction region 14 extends around the periphery of the active region 12. This region is provided to prevent electric field concentration at the edges of the IGBT chip. That is, the electric field reduction region 14 contributes to the electrical strength of the IGBT. Therefore, generally, the higher the operating voltage of an IGBT, the larger the width of the electric field reduction region 14 must be. In the IGBT of the present embodiment, the electric field reduction region has a width d of approximately 2 mm.

Further in the IGBT of the present embodiment, an aluminum electrode 10 extends through the active region 12 and through portions of the electric field reduction region 14. The aluminum electrode 10 is the gate electrode of the MOS region described above and is formed of an Al—Si electrode material. On the other hand, a backside structure 18 is formed on the back side of the silicon substrate 16. The backside structure 18 includes a buffer region and a collector region (described later). A back electrode 20 is formed in contact with the backside structure 18. This electrode is the collector electrode formed on the back side of the IGBT chip.

Figure 3:
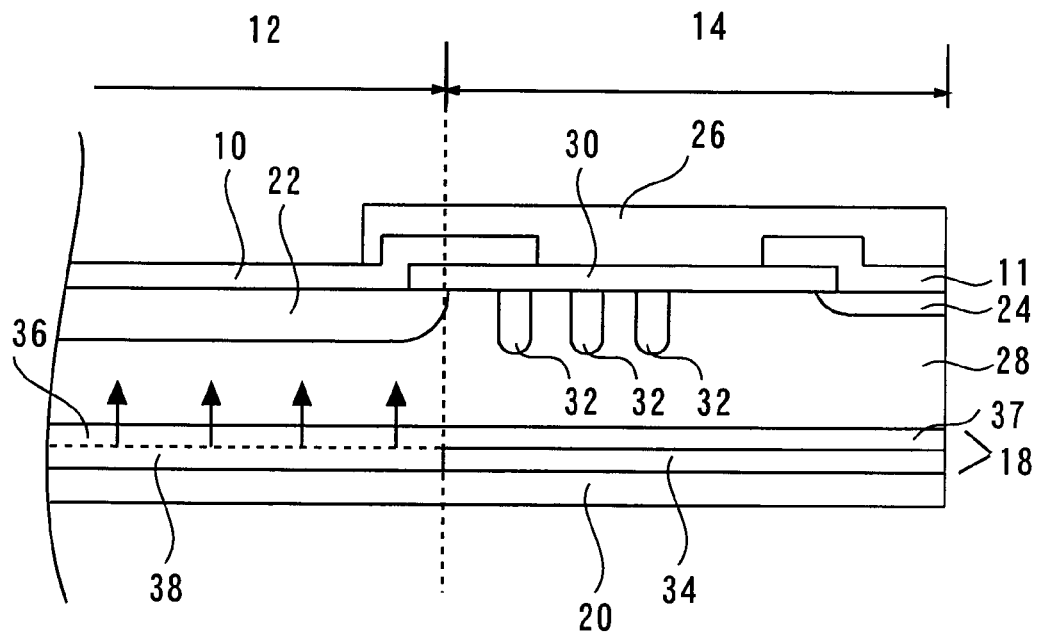
FIG. 3 is a cross-sectional view of contiguous portions of the active region and the electric field reduction region taken along line 3-3 of FIG. 2.
Figure 4:
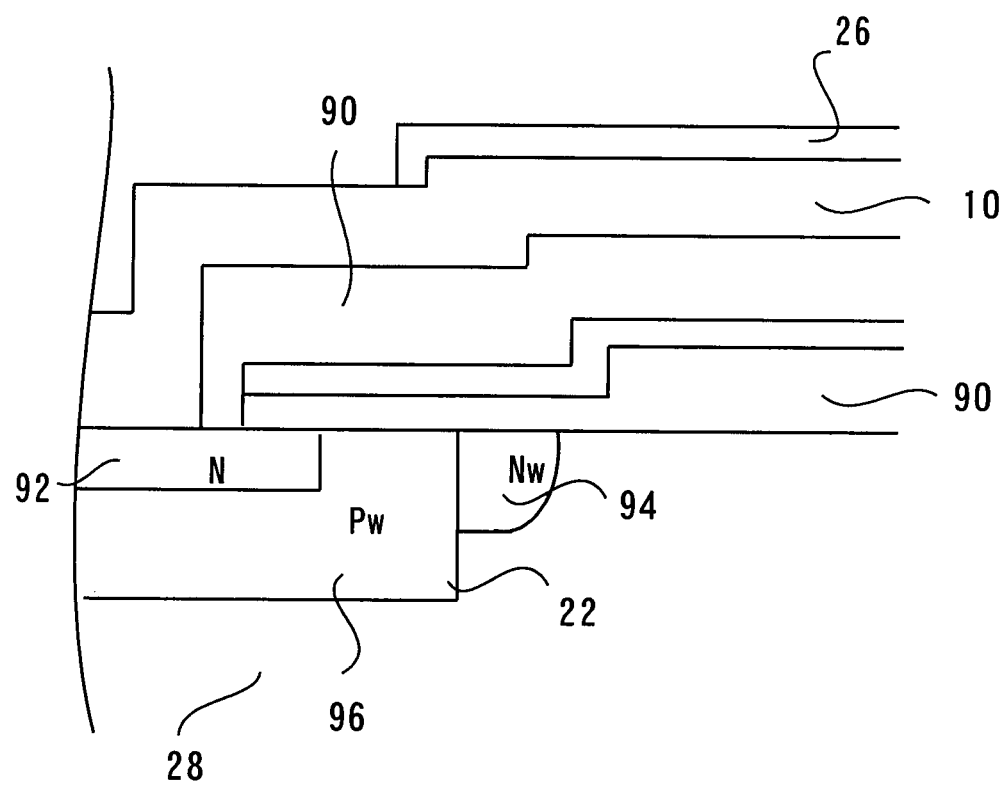
FIG. 4 is an enlarged detail view of the MOS region and adjacent portions of the chip shown in FIG. 3.

FIG. 3 is an enlarged cross-sectional view of contiguous portions of the active region 12 and the electric field reduction region 14 taken along line 3-3 of FIG. 2. The present invention will be described with reference primarily to FIG. 3. First of all, the active region 12 will be described in detail. The active region 12 includes a MOS region 22 (shown in detail in FIG. 4). FIG. 4 is an enlarged detail view of the MOS region 22 and adjacent portions of the chip shown in FIG. 3. The MOS region 22 includes an insulating film 90 in contact with the aluminum electrode 10. The MOS region 22 also includes an N-type emitter region 92 in contact with the insulating film 90. An N-well 94 (of N-type) is disposed on an end of the MOS region 22 and in contact with the insulating film 90 and spaced a predetermined distance from the emitter region 92. A P-type base region 96 is formed in contact with the emitter region 92, the insulating film 90, and the N-well 94 in the MOS region 22. That is, the MOS structure is made up of the aluminum electrode 10, the portion of the insulating film 90 in the MOS region 22, the emitter region 92, the base region 96, and the N-well 94. It should be noted that examples of MOS unit cell structures include trench gate and planar gate DMOS structures.

The MOS region 22 shown in FIG. 3 has the configuration as described above. The active region 12 further includes an N-type electrical strength providing region 28 under the MOS region 22. (That is, the electrical strength providing region 28 is a layer underlying the MOS region 22.) When the IGBT is off, the carrier density in the electrical strength providing region 28 is generally lower than that in the emitter region 92. However, when the IGBT is turned on, carriers are injected from the backside structure 18 into the electrical strength providing region 28, thereby reducing the resistance of the region. In this way, the electrical strength providing region 28 is subjected to conductivity modulation when the IGBT is turned on.

An N-type buffer region 36 is formed in contact with the electrical strength providing region 28. The buffer region 36 is a portion of the backside structure 18 and has a higher carrier density than the electrical strength providing region 28. A P-type active collector region 38 is formed under the buffer region 36. (That is, the P-type active collector region 38 is a layer underlying the buffer region 36.) When the IGBT is turned on, holes are injected from the active collector region 38 into the electrical strength providing region 28. At that time, the buffer region 36 (disposed between the electrical strength providing region 28 and the active collector region 38 as described above) serves to control or reduce this injection of holes from the active collector region 38 into the electrical strength providing region 28. The buffer region 36 also functions to prevent the depletion layer formed in the electrical strength providing region 28 from extending into the active collector region 38 and causing punch-through to occur.

This completes the description of the active region 12. The following description will be directed to the electric field reduction region 14 shown in FIG. 3. It should be noted that the electrical strength providing region 28 extends from the active region 12 into the electric field reduction region 14. That is, the electric field reduction region 28 extends through both the active region 12 and the electric field reduction region 14. The electrical strength providing region 28 in the electric field reduction region 14 is spaced from the aluminum electrode 10 by an interlayer insulating film 30. The interlayer insulating film 30 has a multilayer structure including a thermally oxidized film and PSG (phosphorus glass), Al—Si, and glass-coated (SinSIN) films, etc. The interlayer insulate ng film 30 protects the principal surface of the chip from moisture, damage, magnetic field, etc., and thereby prevents variations in the characteristics of the IGBT.

The electric field reduction region 14 further includes P-type guard rings 32 in contact with the electrical strength providing region 28 and the interlayer insulating film 30. The guard rings 32 (loop-like structures) extend in and along the electric field reduction region 14, that is, extend along the periphery of the active region 12 (see FIGS. 2 and 3). More specifically, the active region 12 is encircled by three concentric guard rings 32.

It should be noted that the guard rings 32 are provided to maintain the collector-emitter voltage at a sufficient level. More specifically, the guard rings 32 reduces electric field concentration at the edges of the IGBT chip. The number and shape of guard rings 32 to be formed in the IGBT are determined by the voltage applied to the IGBT and the required electrical strength of the IGBT chip. Note that the more guard rings 32 are formed, the larger the area of the electric field reduction region 14 must be.

An N-type channel stopper 24 is disposed between the guard ring structure 32 and the periphery of the IGBT chip (close to the periphery of the IGBT chip) and in contact with an aluminum electrode 11 and the electrical strength providing region 28. The channel stopper 24 has a higher carrier density than the electrical strength providing region 28 and serves to prevent the depletion layer from extending into the edges of the IGBT chip. Thus, the channel stopper 24 prevents a situation where the depletion layer extending from the MOS structure 22 reaches the edges of the IGBT chip. The structure (shape, size, etc.) of the channel stopper 24 is determined by the voltage class of the IGBT chip.

In the electric field reduction region 14, a buffer region 37 is disposed on and in contact with the back side of the electrical strength providing region 28. According to the present embodiment, the buffer region 37 in the electric field reduction region 14 and the buffer region 36 in the active region 12 are of the same conductivity type and have the same carrier density. They are contiguously disposed relative to each other and form a single larger buffer region.

The electric field reduction region 14 further includes an inactive collector region 34 in contact with the back side of the buffer region 37. The inactive collector region 34 contains a P-type dopant such as boron. However, the inactive collector region 34 has a lower hole density than the active collector region 38, since its dopant is not activated or not sufficiently activated by heat treatment, etc. It should be noted that the active collector region 38 meets and contacts the inactive collector region 34 at the border between the active region 12 and the electric field reduction region 14. The active collector region 38 and the inactive collector region 34 form an entire collector region. A back electrode 20 is formed on the back sides of the active collector region 38 and the inactive collector region 34. This completes the description of the electric field reduction region 14.

Figure 5:
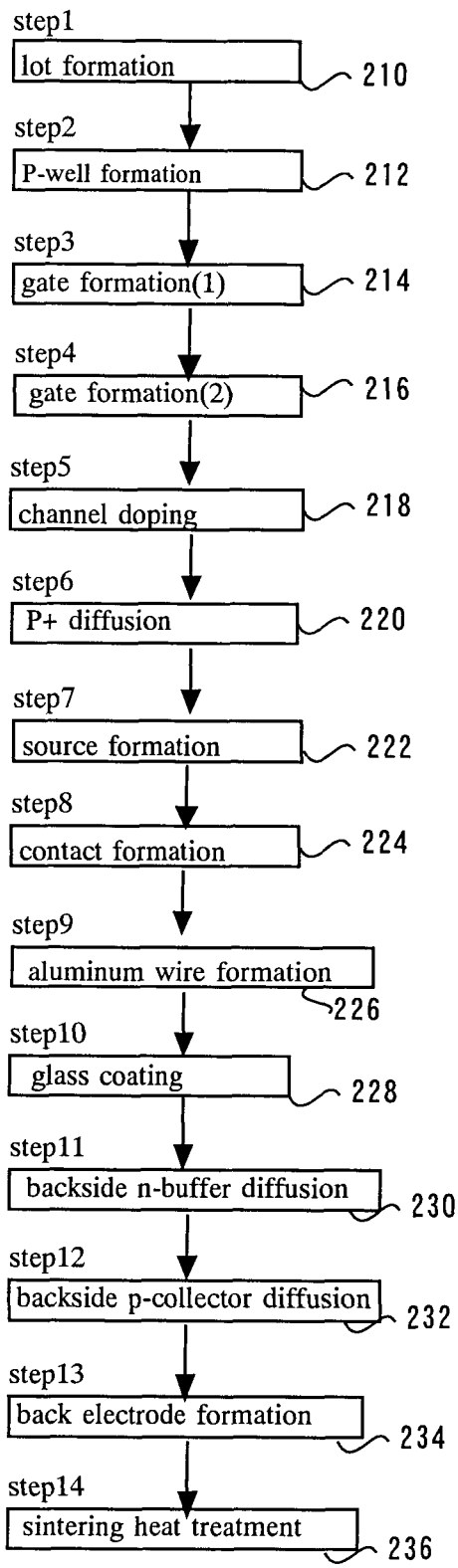
FIG. 5 is a schematic illustration of a process flow for manufacturing the IGBT of the first embodiment.

The configuration of the IGBT (a power semiconductor device) of the present embodiment has been described above with reference to FIGS. 1 to 4. The following description will be directed to a method for manufacturing the IGBT of the present embodiment. FIG. 5 schematically illustrates a process flow for manufacturing the IGBT of the present embodiment. All device regions other than the backside structure 18 and the back electrode 20 are formed by the first ten steps (namely, "lot formation (210)," P-well formation (212), gate formation (1)(214), gate formation (2)(216), channel doping (218), P$^+$ diffusion (220), source formation (222), contact formation (224), aluminum wire formation (226), and glass coating (228). A description of these steps is not provided herein since they are all well known in the art.

After step 10 (the glass coating step), the backside structure 18, etc. (described with reference to FIG. 3) are formed by steps 11(230) and 12(232). Step 11(230) proceeds as follows. First, a reinforcing tape is adhered to the surface of the wafer to protect the surface and prevent breakage of the wafer even if its backside portion is ground to a small thickness.

The wafer is then ground on the back side by a back grinder to a predetermined thickness. 10-20 μm of material is subsequently removed from the back surface by an etchant to remove the crushed layer (i.e., the layer damaged by the above grinding process). Next, the entire back surface of the wafer thus formed is ion-implanted by a P ion implanter. The implanted ions are then activated by a laser annealing apparatus. According to the present embodiment, this laser annealing apparatus is a YAG laser and scans the back surface of the wafer to anneal predetermined areas.

During the annealing process at step 11, the laser power is maintained constant to equally activate the ions in the buffer regions 36 and 37 formed on the back side of the IGBT chip. As a result, the buffer regions 36 and 37 have the same carrier density.

After step 11, the active collector region 38 and the inactive collector region 34 are formed at step 12(232). Specifically, the entire back surface of the wafer is first ion-implanted by a B ion implanter. Laser annealing is then performed as follows. The laser annealing apparatus first receives information on the layout of the principal (back) surface of the wafer (the IGBT chip) and then anneals the surface based on this layout information. That is, the laser annealing apparatus anneals the electric field reduction region 14 with reduced laser power and the active region 12 with increased laser power. The increased laser power allows the target area (i.e., the active collector region 38) to be annealed at approximately 1000° C. to a depth of approximately 10 μm (in the wafer thickness direction). Thus, the ions in each predetermined area can be selectively activated to a desired degree by the laser annealing apparatus. Through such a process, the ions in the active collector region 38 and in the inactive collector region 34 of the present embodiment are activated to different degrees to cause these regions to have different carrier densities.

After step 12, the back electrode 20 is formed at step 13(234). Specifically, in preparation for forming the electrode, the oxide layer formed on the back surface of the wafer is first removed by a mixture of HF and water in the ratio of approximately 1:100. The back electrode 20 is then formed to have a 4-layer structure of Al/Mo/Ni/Au or Al/Ti/Ni/Au.

After step 13, a sintering heat treatment is carried out at step 14(236). Specifically, the back electrode 20 is heat treated at approximately 400° C. for approximately 30 minutes to ensure adhesion and ohmic contact between the back electrode 20 and the wafer.

Figure 6:
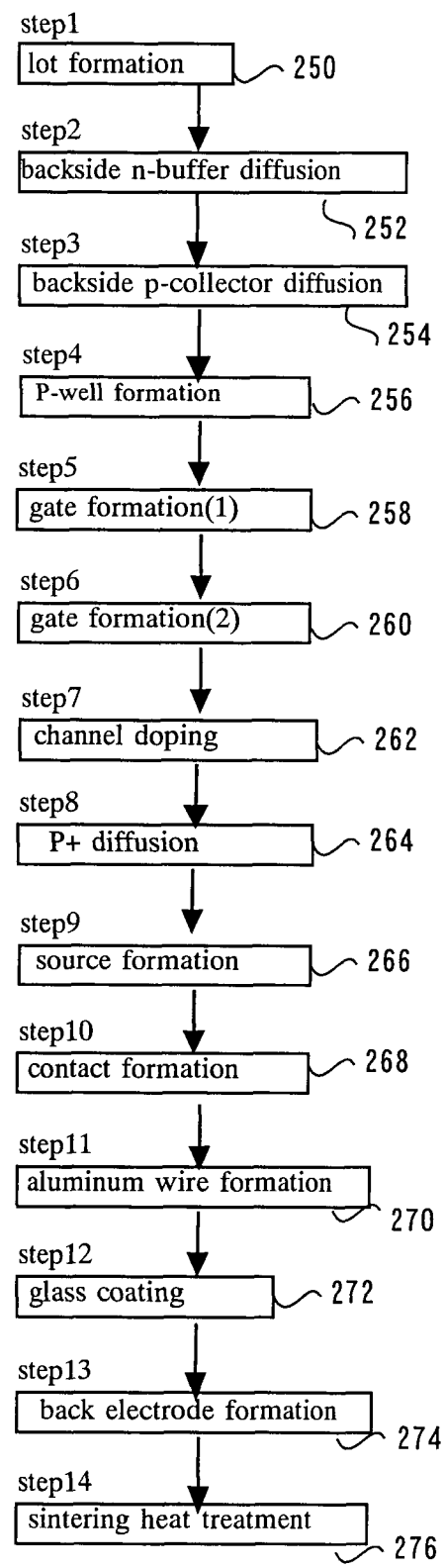
FIG. 6 shows a process flow for manufacturing a first comparative IGBT.

To better understand the IGBT and the manufacturing method of the present embodiment, it will be helpful to describe comparative conventional IGBTs and manufacturing methods therefor. FIG. 6 shows a process flow for manufacturing a first comparative IGBT(250,252,254,256,258, 260,262,264,266,268,270,272,274,276). In this process flow, the backside N-buffer diffusion at step 2(252) and the backside P-collector diffusion at step 3(254) requires annealing to activate the implanted ions. In this manufacturing method, the buffer region and the collector are formed by thermal diffusion. Therefore, for example, when the buffer region is formed over the entire back surface of the wafer by thermal diffusion, the implanted ions in the buffer region (formed over the entire back surface of the wafer) are equally activated by the applied heat. An analogous situation occurs when the collector is formed over the entire back surface of the wafer.

Figure 7:
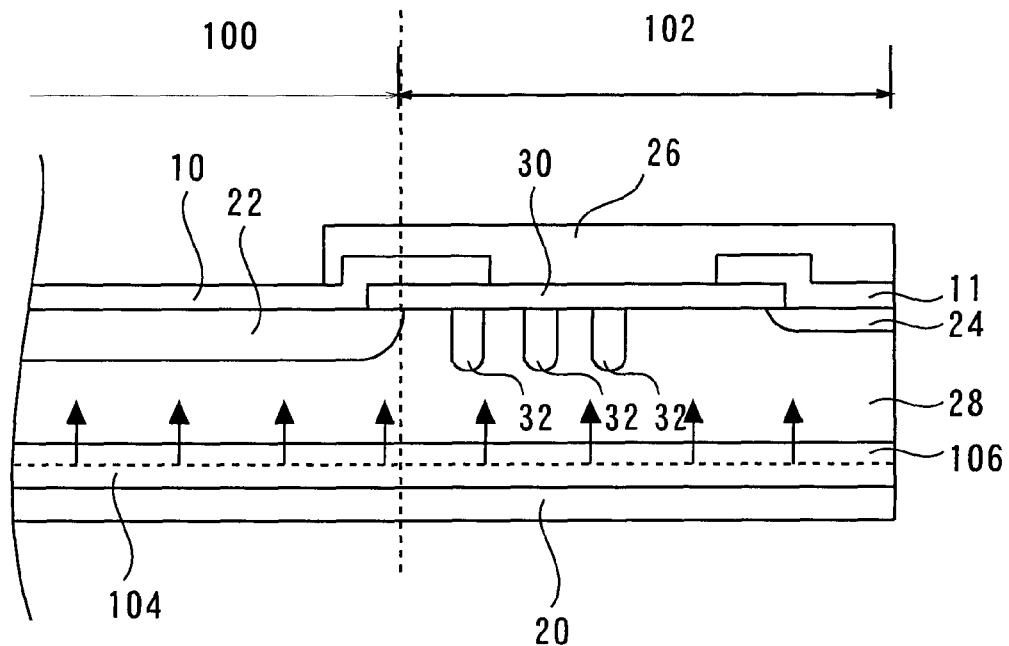
FIG. 7 is an enlarged cross-sectional view of contiguous portions of the active region and the electric field reduction region of the first comparative IGBT.

FIG. 7 is an enlarged cross-sectional view of contiguous portions of the active region 100 and the electric field reduction region 102 of the first comparative IGBT (manufactured in accordance with the process flow shown in FIG. 6). In this IGBT, the buffer region (106) and the collector region (104) are formed over the entire back surface of the wafer. Since these buffer and collector regions are formed by thermal diffusion, the implanted ions in each region (formed over the entire back surface of the wafer) are equally activated by the applied heat, as described above. As a result, the buffer region has a uniform carrier density across the entire back surface of the wafer and so does the collector region. These are features of the first comparative IGBT.

Figure 8:
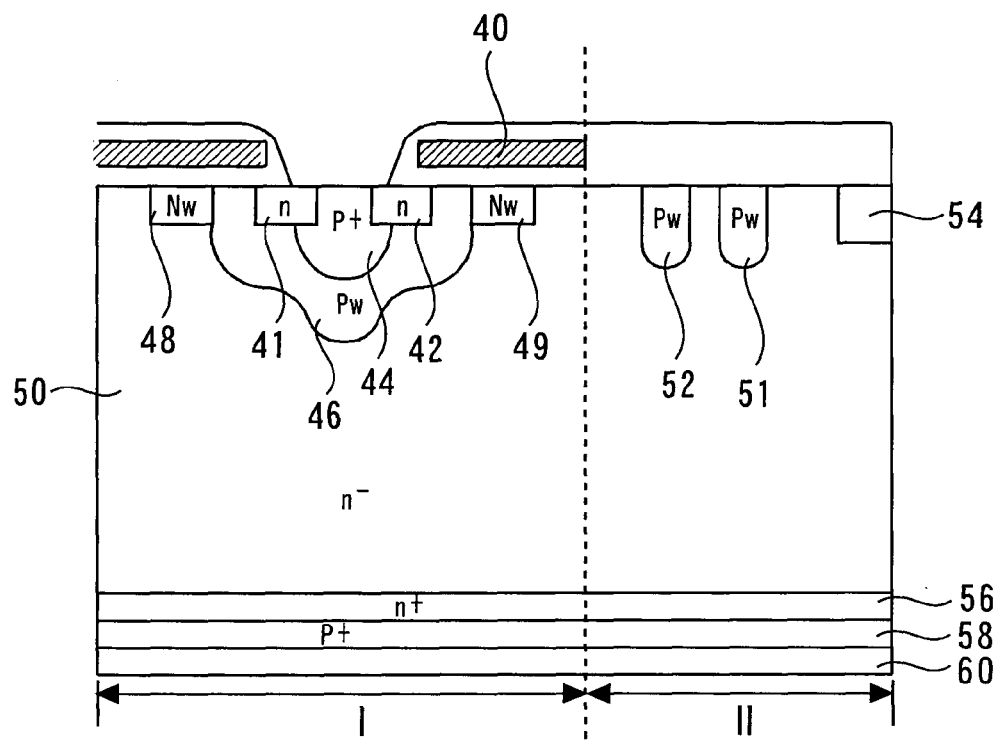
FIG. 8 is a cross-sectional view of an IGBT having a backside structure similar to that of the first comparative IGBT.

A problem with the configuration of the first comparative IGBT will be described with reference to FIG. 8. FIG. 8 is a cross-sectional view of an IGBT having a backside structure similar to that of the first comparative IGBT. When this IGBT is turned off by removing the gate voltage from the gate electrode 40, it is desirable that the holes in the electrical strength providing region 50 are caused to quickly move into the collector 58, etc. to reduce the tail current. However, in the case where the holes in the entire portion of the collector region 104 (formed over the entire back surface of the wafer) are in an active state, as in the first comparative IGBT, an excessive number of holes are injected from the collector region 104 into the electrical strength providing region (when the IGBT is turned on). Of course, in order to reduce the on-state voltage of the IGBT, the electrical strength providing region preferably contains a large number of holes and thereby is subjected to conductivity modulation, since the electrical strength providing region provides most of the resistance of the IGBT. However, if a large number of holes are present in the electrical strength providing region when the IGBT is turned off, the parasitic NPNP thyristor formed by the emitter 42, the base 46, the electrical strength providing region 50, and the collector 58 may turn on, resulting in degraded controllability of the current of the IGBT.

Figure 9:
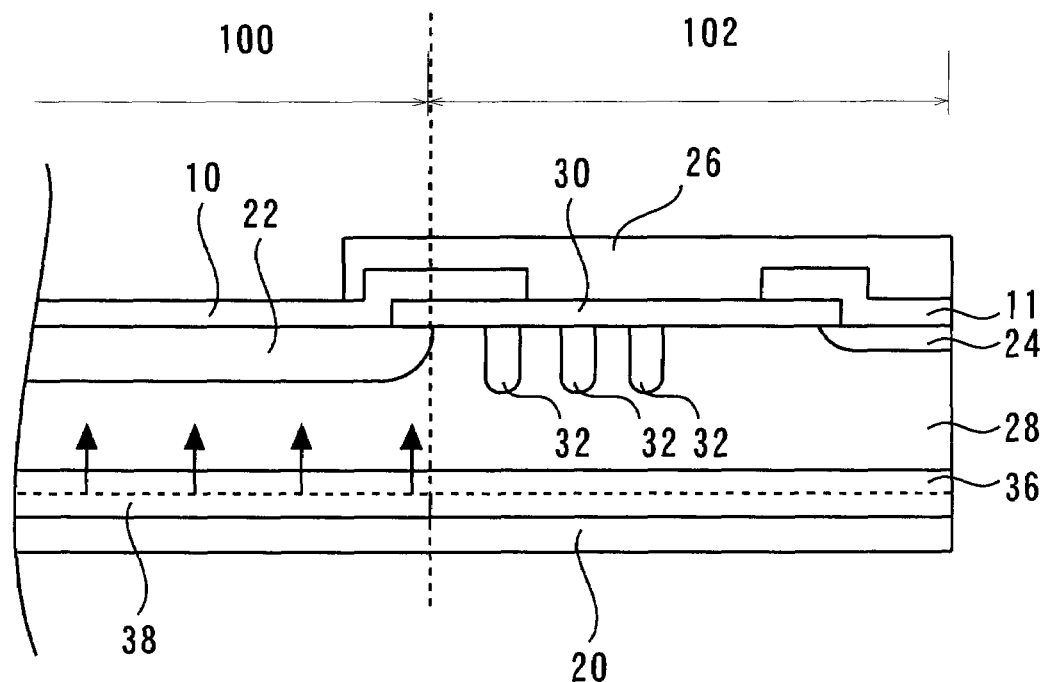
FIG. 9 is an enlarged cross-sectional view of contiguous portions of the active region and the electric field reduction region of the second comparative IGBT.

A second comparative IGBT will now be described with reference to FIG. 9. This IGBT differs from the first comparative IGBT in that its electric field reduction region 102 does not include an active collector region. (The active region 100 of the second comparative IGBT includes an active collector region 38.) The term "active collector region" refers to a collector region that injects holes of sufficient quantity into the electric strength providing region and thereby causes conductivity modulation therein when the IGBT is turned on. In the second comparative IGBT, only the active region 100 includes an active collector region (i.e., the active collector region 38). (That is, the active collector region does not extend into the electric field reduction region.) Therefore, since an excessive number of holes are not injected from the active collector region into the electrical strength providing region, the parasitic thyristor is less likely to turn on than in the case of the first comparative IGBT.

In the manufacture of the second comparative IGBT, when the collector region is formed, ions are implanted only in the back side of the active region 100 using a mask. That is, ions are not implanted in the back side of the electric field reduction region 102 and hence the collector region does not extend into the electric field reduction region. A back electrode 20 is formed on such a wafer back surface. Therefore, it may not be able to establish ohmic contact between the back electrode 20 and the electric field reduction region 102 of the wafer. That is, the configuration of the second comparative IGBT makes it difficult to reduce the device resistance.

Thus, the first comparative IGBT is disadvantageous in that the parasitic thyristor may turn on when the IGBT is turned off. Further, the second comparative IGBT is disadvantageous in that the back electrode may not be fully in ohmic contact with the wafer.

On the other hand, the IGBT of the present embodiment is adapted to prevent the turn-on of the parasitic thyristor. Further in this IGBT, the back electrode is fully in ohmic contact with the back side of the electric field reduction region of the wafer. Further, as shown in FIG. 3, the inactive collector region 34 (not an active collector region) is formed on the back side of the electric field reduction region 14, thereby preventing injection of an excessive number of holes into the electrical strength providing region when the IGBT is turned on. This prevents the turn-on of the parasitic thyristor when the IGBT is turned off (as described above). It should be noted that since the IGBT of the present embodiment includes the inactive collector region 34, the quantity of holes injected into the electrical strength providing region 28 when the IGBT is turned on is small, as compared to the case where the active collector region covers the entire back side of the IGBT chip. However, it is primarily the holes injected from the back side of the active region 12 that reduce the effective resistance of the electrical strength providing region 28 when the IGBT is turned on. Therefore, the hole density of the electric field reduction region is not important in reducing the device resistance of the IGBT. That is, although the IGBT of the present embodiment does not have an active collector region on the back side of its electric field reduction region 14, its electrical strength providing region 28 has sufficiently low resistance.

Thus, the present embodiment allows an IGBT to have increased short circuit capacity without increasing the effective resistance of the electrical strength providing region 28.

Further, in the case of the IGBT of the present embodiment, the active and inactive collector regions are formed by implanting the entire back surface of the chip with a B dopant by use of a B ion implanter. The dopant-implanted back surface and the back electrode 20 formed thereon are subjected to sintering heat treatment so that they are fully in ohmic contact with each other. This means that the active and inactive collector regions (forming the entire collector region) are fully in ohmic contact with the back electrode 20. In the case of the second comparative IGBT, on the other hand, the back side of the electric field reduction region 102 includes only a buffer region and does not include a collector region. (That is, this region has not been implanted with ions to form a collector.) Therefore, it is difficult to establish ohmic contact between the back electrode and the electric field reduction region 102 even by sintering heat treatment. On the other hand, ion implanting the entire back surface of the wafer to form a collector region therein (as in the IGBT of the present embodiment) results in full ohmic contact between the back electrode and the entire back surface of the wafer (or the IGBT chip).

Figure 10:
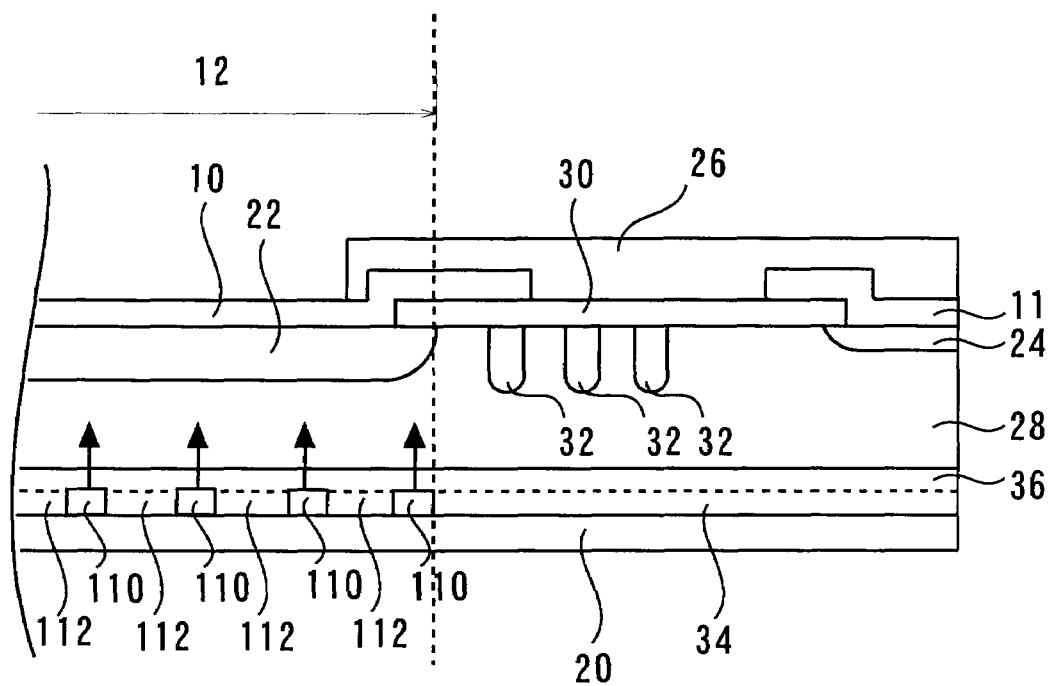
FIG. 10 is an enlarged cross-sectional view of contiguous portions of the active region and the electric field reduction region of the variant of the first embodiment.

Although in the present embodiment the back side of the active region 12 includes the active collector region 38, in other embodiments it may include alternately disposed active collector regions 110 and inactive collector regions 112, instead of the active collector region 38, as shown in FIG. 10. This arrangement also prevents injection of an excessive number of holes into the electrical strength providing region and hence achieves the effect of the present invention.

Although in the present embodiment the emitter, the base, the electrical strength providing region, and the collector contain N-type, P-type, N-type, and P-type carriers, respectively, in other embodiments they may contain P-type, N-type, P-type, and N-type carriers, respectively (i.e., their carrier conductivity types are reversed), with the same effect.

Although in the present embodiment the guard rings 32 are disposed in the electric field reduction region 38 to prevent electric field concentration, in other embodiment a field plate structure, etc. may be used instead of the guard rings 32 to reduce electric field. Such a structure can also function as an electric field reduction region and hence achieve the effect of the present invention.

Further, although in the present embodiment the active collector region 38 and the inactive collector region 34 meet at the border between the active region 12 and the electric field reduction region 14, in other embodiments these collector regions may meet at a different location determined by the required short circuit capacity or other required characteristics. That is, they may meet within the active region 12 or within the electric field reduction region 14.

Second Embodiment

A second embodiment of the present invention relates to an IGBT (a power semiconductor device) in which the ions in the buffer region are activated to such a level as to optimize the characteristics of the IGBT, and also relates to a method for manufacturing such an IGBT. The following description of the IGBT of the present embodiment will be directed only to the differences from the IGBT of the first embodiment shown in FIG. 3.

Figure 11:
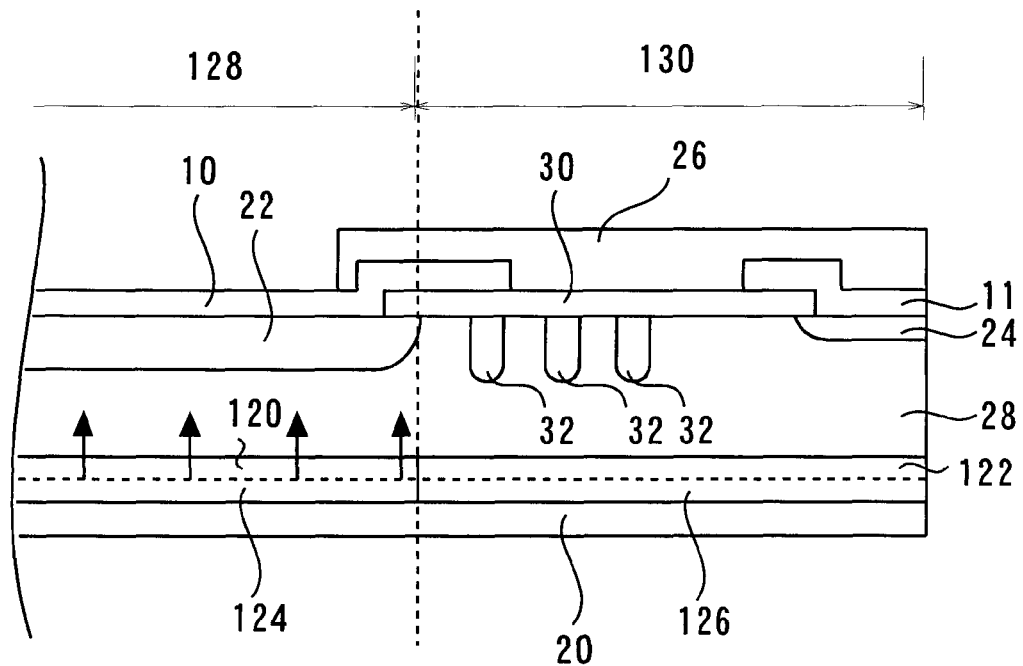
FIG. 11 is an enlarged cross-sectional view of contiguous portions of the active region and the electric field reduction region of the second embodiment.

The configuration of the IGBT of the present embodiment will be described with reference to FIG. 11. The IGBT (a power semiconductor device) of the present embodiment includes an active region 128 and an electric field reduction region 130. The buffer region 122 in the electric field reduction region 130 is in contact with the buffer region 120 in the active region 128. Both buffer regions are of a first conductivity type. The buffer region 122 has a higher carrier density than the buffer region 120. This is achieved by annealing the buffer region 122 with higher laser power than that used to anneal the buffer region 120.

The collector of the IGBT of the present embodiment includes an active collector region 124 and an inactive collector region 126. The active collector region 124 is formed on the back side of the active region 128, and the inactive collector region 126 is formed on the back side of the electric field reduction region 130. The active collector region 124 has a higher carrier density than the inactive collector region 126. This is achieved by annealing the active collector region 124 with higher laser power than that used to anneal the inactive collector region 126.

Thus, the IGBT of the present embodiment is characterized in that the buffer region 122 in the electric field reduction region 130 has a higher carrier density than the buffer region 120 in the active region 128. That is, the buffer region 122 contributes to preventing injection of holes from the electric field reduction region 130 into the electrical strength providing region 28, thereby preventing the turn-on of the parasitic thyristor and increasing the short circuit capacity.

Figure 12:
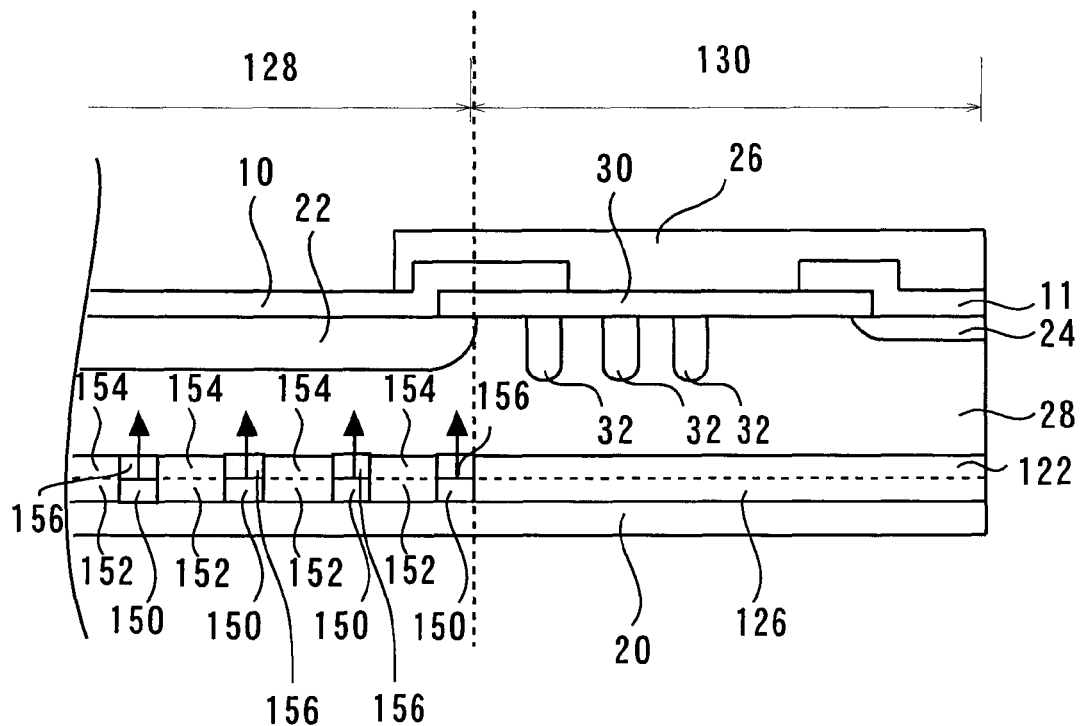
FIG. 12 is an enlarged cross-sectional view of contiguous portions of the active region and the electric field reduction region of the variant of the second embodiment.
Figure 13:
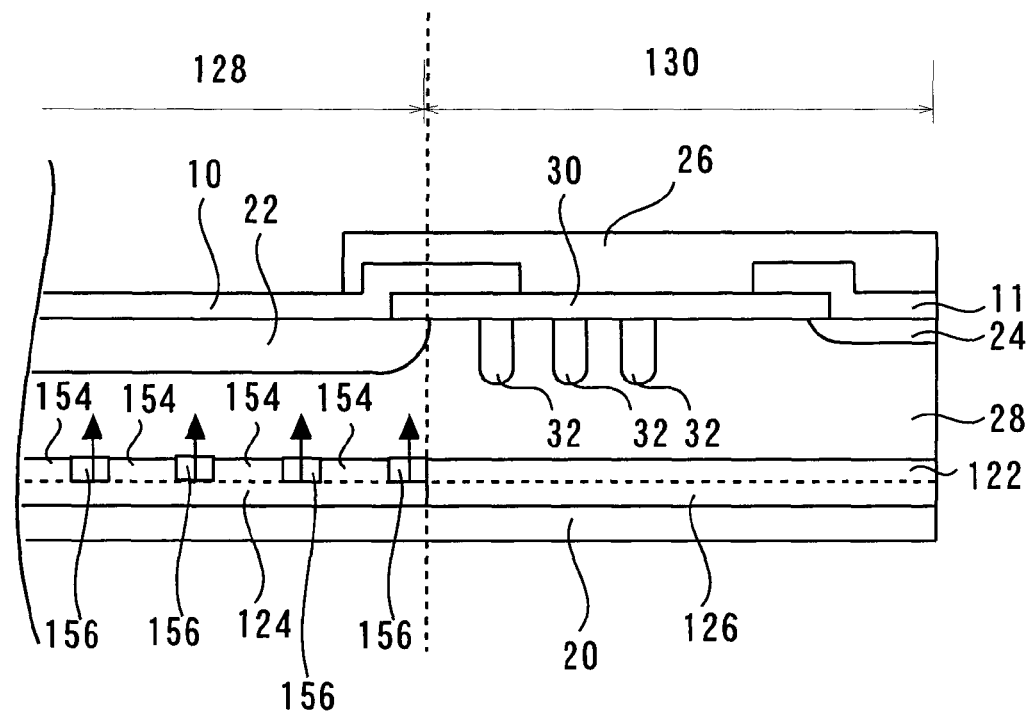
FIG. 13 is an enlarged cross-sectional view of contiguous portions of the active region and the electric field reduction region of the variant of the second embodiment.

Although in the present embodiment the buffer region 122 in the electric field reduction region 130 has a higher carrier density than the buffer region 120 in the active region 128, in other embodiments buffer regions (156) having a high carrier density may be arranged at appropriate locations in the active region 128, as shown in FIG. 12 or 13, to control or reduce the number of holes injected into the electrical strength providing region 28 and hence achieve the effect of the present invention. It should be noted that in FIGS. 12 and 13, buffer regions 156 has a lower carrier density than buffer regions 154 and 122. In FIG. 12, collector regions 152 have a lower carrier density than active collector regions 150. Further, in FIG. 13, an active collector region 124 has a higher carrier density than an inactive collector region 126.

Figure 14:
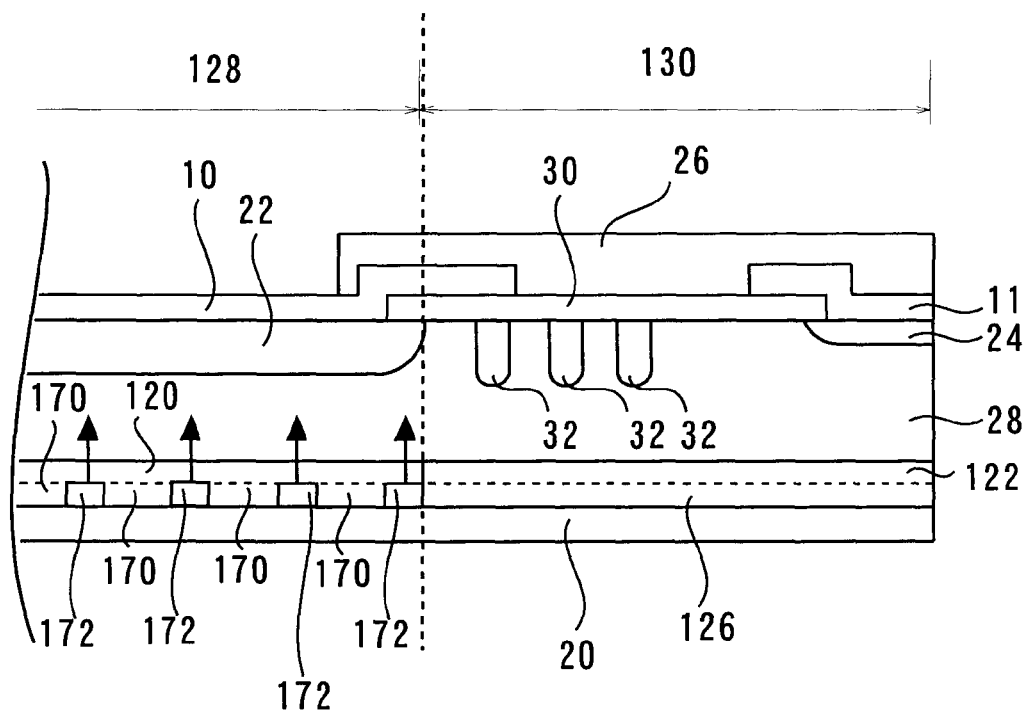
FIG. 14 is an enlarged cross-sectional view of contiguous portions of the active region and the electric field reduction region of the variant of the second embodiment.

Further, in other embodiments, the buffer region 122 having a higher carrier density than the buffer region 120 may be formed in the electric field reduction region, and inactive collector regions 170 may be arranged at appropriate locations in the active region, as shown in FIG. 14, to control or reduce the number of holes injected into the electrical strength providing region 28 and hence achieve the effect of the present invention. It should be noted that in FIG. 14, active collector regions 172 have a higher carrier density than the inactive collector regions 170.

Thus, the present invention can improve the switching characteristics of a power semiconductor device without degrading other characteristics.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2007-180931, filed on Jul. 10, 2007 including specification, claims, drawings and summary, on which the Convention priority of the present application is based, are incorporated herein by reference in its entirety.

What is claimed is:

1. A power semiconductor device having an active region and an electric field reduction region, the device comprising:
an emitter region of a first conductivity type;
a base region of a second conductivity type in contact with said emitter region;
an electrical strength providing region of said first conductivity type in contact with said base region;
a collector region of said second conductivity type in contact with said electrical strength providing region;
a collector electrode in contact with said collector region; and
a buffer region of said first conductivity type formed between said electrical strength providing region and said collector region,
wherein
a first portion of said collector region is disposed on said active region and a second portion of said collector region is disposed on said electric field reduction region, each portion of said collector region containing a dopant of said second conductivity type,
said first portion of said collector region includes alternately disposed first regions and second regions, said first regions having a higher density of carriers of said second conductivity type than said second regions and said second portion of said collector region, each of said second regions having a width larger than each of said first regions a first portion of said buffer region is disposed on said active region and a second portion of said buffer region is disposed on said electric field reduction region, and the second portion of said buffer region has a higher density of carriers of said first conductivity type than said first portion of said buffer region.

2. The power semiconductor device as claimed in claim 1, wherein said buffer region has a higher density of carriers of said first conductivity type than said electrical strength providing region.

3. The power semiconductor device as claimed in claim 1, wherein a portion of said electrical strength providing region in said electric field reduction region includes a guard ring of said second conductivity type and a channel stopper region of said first conductivity type, and said channel stopper region is spaced a greater distance from said active region than is said guard ring and has a higher density of carriers of said first conductivity type than the other portions of said electrical strength providing region.

4. The power semiconductor device as claimed in claim 1, further comprising:

a well region of said first conductivity type disposed on an end of said base region, wherein said electrical strength providing region of said first conductivity type is in contact with said well region, and said well region is spaced a predetermined distance from said emitter region.

5. The power semiconductor device as claimed in claim 1, wherein a portion of said electrical strength providing region in said electric field reduction region includes a field plate structure.

6. The power semiconductor device as claimed in claim 1, wherein said first portion of said collector region is in contact with said second portion of said collector region and said first portion of said collector region is partially disposed on said electric field reduction region.

7. The power semiconductor device as claimed in claim 1, wherein said first portion of said collector region is in contact with said second portion of said collector region and said second portion of said collector region is partially disposed on said active region.

8. A power semiconductor device having an active region and an electric field reduction region and comprising:

an emitter region of a first conductivity type;

a base region of a second conductivity type in contact with said emitter region;

an electrical strength providing region of said first conductivity type in contact with said base region;

a collector region of said second conductivity type in contact with said electrical strength providing region; and a buffer region of said first conductivity type formed between said electrical strength providing region and said collector region, wherein a first portion of said collector region is disposed on said active region and a second portion of said collector region is disposed on said electric field reduction region, each portion of said collector region containing a dopant of said second conductivity type, said first portion of said collector region includes alternately disposed first regions and second regions, said first regions having a higher density of carriers of said second conductivity type than said second regions and said second portion of said collector region, each of said second regions has a width larger than a width of each said first regions, a first portion of said buffer region is disposed on said active region and a second portion of said buffer region is disposed on said electric field reduction region, and the second portion of said buffer region has a higher density of carriers of said first conductivity type than said first portion of said buffer region.

* * * * *